(12) United States Patent
Rybka et al.

(10) Patent No.: US 7,367,114 B2
(45) Date of Patent: May 6, 2008

(54) METHOD FOR PLASMA ETCHING TO MANUFACTURE ELECTRICAL DEVICES HAVING CIRCUIT PROTECTION

(75) Inventors: Matthew Rybka, Chicago, IL (US); Thomas Restis, Des Plaines, IL (US)

(73) Assignee: Littelfuse, Inc., Des Plaines, IL (US)

( * ) Notice: Subject to any disclaimer, the term of this patent is extended or adjusted under 35 U.S.C. 154(b) by 223 days.

(21) Appl. No.: 10/227,887

(22) Filed: Aug. 26, 2002

(65) Prior Publication Data

US 2004/0034993 A1 Feb. 26, 2004

(51) Int. Cl.
*H01H 69/02* (2006.01)

(52) U.S. Cl. .................. 29/623; 29/610.1; 29/830; 29/852; 337/290; 338/22 R; 216/67

(58) Field of Classification Search ............... 29/592.1, 29/610.1, 612, 619, 620, 621–623, 842, 846, 29/852, 830; 338/20, 22 R, 322; 216/46, 216/62, 67, 17, 39; 438/714; 337/290
See application file for complete search history.

(56) References Cited

U.S. PATENT DOCUMENTS

| | | | | |
|---|---|---|---|---|
| 4,654,115 A | * | 3/1987 | Egitto et al. .................. 134/1.1 |
| 4,786,888 A | * | 11/1988 | Yoneda et al. ............. 338/22 R |
| 5,653,893 A | * | 8/1997 | Berg ........................... 216/17 |
| 5,729,897 A | * | 3/1998 | Schmidt et al. ................ 29/852 |
| 5,790,008 A | | 8/1998 | Blecha et al. |
| 5,907,272 A | * | 5/1999 | McGuire ................... 338/22 R |
| 6,040,755 A | * | 3/2000 | Abe et al. .................. 338/22 R |
| 6,392,528 B1 | * | 5/2002 | Myong ....................... 338/22 R |
| 6,559,486 B2 | * | 5/2003 | Ueda ........................... 257/217 |
| 6,640,420 B1 | * | 11/2003 | Hetherton et al. ............. 29/612 |
| 6,642,150 B1 | * | 11/2003 | Huang et al. .................. 216/60 |
| 6,838,388 B2 | * | 1/2005 | Tadokoro et al. ........... 438/714 |
| 6,838,972 B1 | * | 1/2005 | Minervini et al. ......... 338/22 R |

OTHER PUBLICATIONS

Article entitled "Plasma Etching and Desmearing of Through Holes in the PWB Industry" published by Advanced Plasma Systems, Inc., 1995.

(Continued)

*Primary Examiner*—Donghai D. Nguyen
(74) *Attorney, Agent, or Firm*—Bell, Boyd & Lloyd LLP

(57) ABSTRACT

Methods of manufacturing a variety of circuit protection devices are provided as well as devices so manufactured. In an embodiment, a surface mount electrical device having a substrate and a pair of conductive electrodes connected to an electrical protection component for sensing current or voltage is provided. The method includes the steps of: (i) providing a substrate having a first surface and a second surface; creating a first and second aperture, plasma etching a through-hole, slot or bore through the substrate; (ii) depositing a conductive material on the substrate and through the apertures to form the electrodes, wherein the conductive material extends through the apertures and on the first and second surfaces of the substrate, respectively; and (iii) depositing the electrical protection component on the first surface of the substrate to electrically connect the electrodes.

3 Claims, 7 Drawing Sheets

OTHER PUBLICATIONS

Article entitled "Low Cost Through-hole Activation Method for PTFE Based Substrates" written by Carlos Burton, Robert Daigle, and Stephen Kosto and published by Advanced Plasma Systems, Inc., 1995.

Advanced Plasma Systems, Inc. "PWB-Series Technical Data" Advertisement, undated.

Advanced Plasma Systems Inc. "Now You Can Achieve the Ultimate Quality For Your Printed Wire Boards" Advertisement, undated.

Advanced Plasma Systems, Inc. brochure "Advanced Technology For The Printed Wire Board Industry," undated.

Advanced Plasma Systems, Inc. Company Brochure, undated.

* cited by examiner

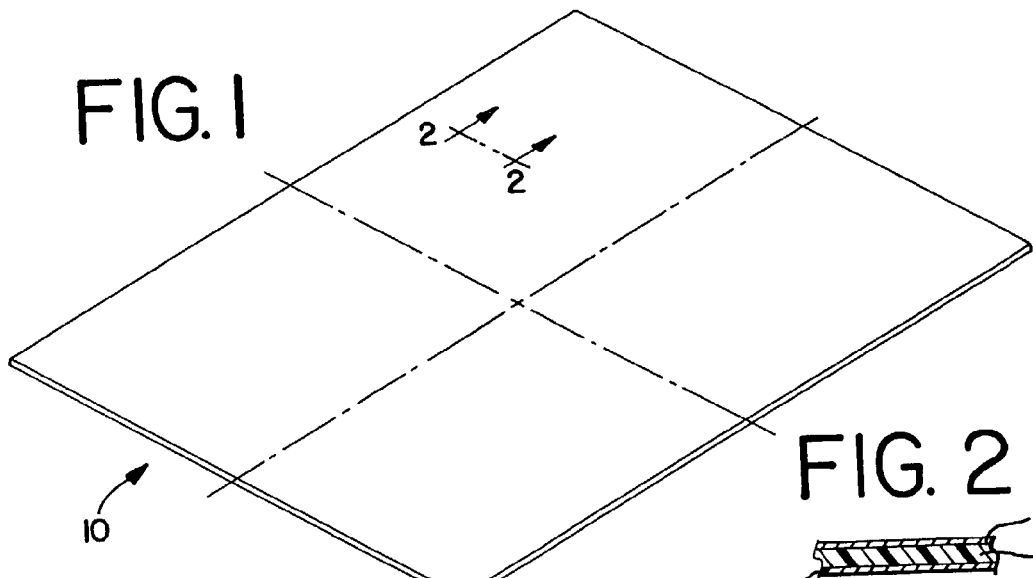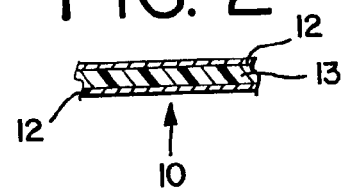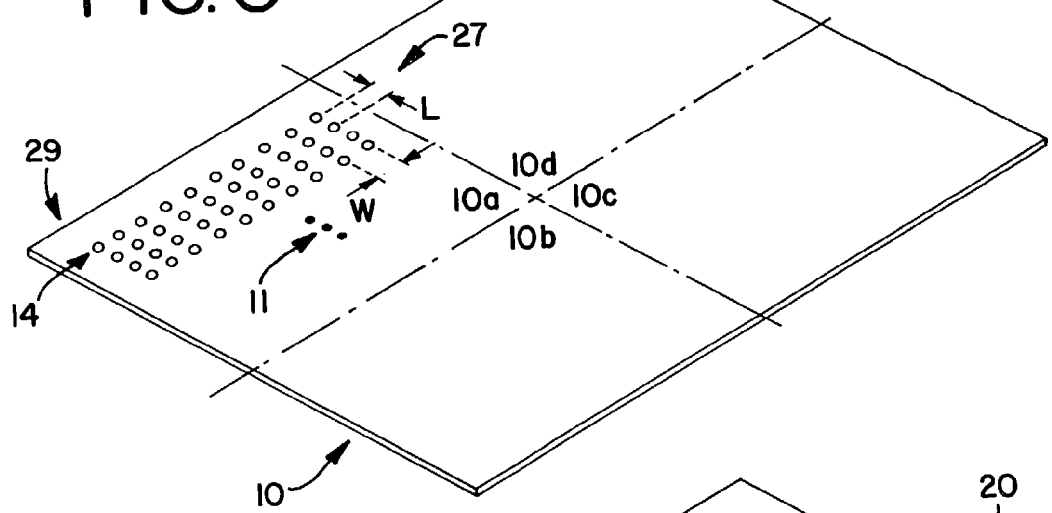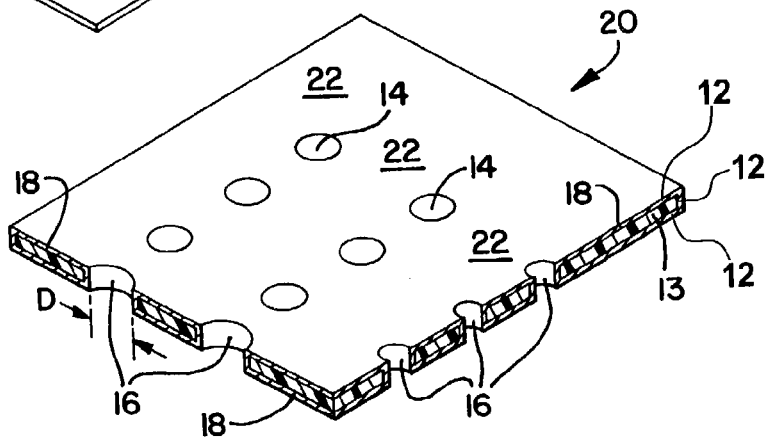

METHOD FOR PLASMA ETCHING TO MANUFACTURE ELECTRICAL DEVICES HAVING CIRCUIT PROTECTION

BACKGROUND OF THE INVENTION

The present invention relates generally to electrical devices. More specifically, the present invention relates to methods of manufacturing devices having circuit protection.

Printed circuit (PC) boards have found increasing application in electrical and electronic equipment of all kinds. For example, an onslaught of wireless communications has created the need for large quantities of low cost, high performance circuit boards. In addition to increasing the performance of such devices, manufacturers strive to reduce the physical size of the devices.

Of course, given the sensitive nature of such devices, it is necessary to protect these printed circuit boards against electrical overloads and overvoltage. This protection may be provided by temperature, voltage or current protection components that are physically secured to the PC board. For example, such protection can be provided by positive temperature coefficient (PTC) elements, electrostatic discharge surface-mounted devices (ESD/SMD), and subminiature fuses.

PC boards often incorporate bores, through-holes, slots or apertures within the substrate of the PC board. Traditionally, a drilling process is used to create the apertures. Drilling processes can be used to create through-holes, holes that extend all the way through a device, or blind holes. A blind hole is an aperture that extends from a surface to a layer thereunder. Blind holes do not extend through the device. Heretofore, such blind holes could only be created through the use of a drilling process.

However, drilling processes typically generate a resin smear on the substrate. This resin smear can cover the surface of the conductive inner layers and prevent good electrical connection. Expensive and environmentally harsh chemical processes typically must be used to remove the resin smear.

Thus, there is a need for new processes and methods for producing through-holes and other apertures in substrates, such as printed circuit boards, flexible circuits and the like.

SUMMARY OF THE INVENTION

Generally stated, this invention sets forth methods for manufacturing devices including circuit protection.

In an embodiment, a surface-mount electrical device having a substrate and a pair of conductive electrodes is connected to an electrical protection component. According to one aspect of the invention, the method comprises the steps of: providing a substrate having a first surface and a second surface; creating first and second apertures through the substrate by plasma processing; depositing a conductive material on the substrate and through the apertures to form the electrodes, wherein the conductive material extends through the apertures and on the first and second surfaces, respectively; and electrically connecting the electrodes with the electrical protection component.

In a further embodiment, a method of manufacturing a surface mount electrical device having a substrate, an electrical protection component on the substrate, and a pair of conductive electrodes coupled to the electrical protection component is provided. The method comprises the steps of: providing a substrate having a first surface and a second surface; masking portions of the first surface of the substrate; creating a first and second aperture from the first surface to the second surface of the substrate by plasma processing unmasked portions of the substrate; depositing a conductive material on the substrate and through the apertures to form the electrodes, wherein the conductive material extends through the apertures and on the first and second surfaces, respectively; and electrically connecting the electrodes with the electrical protection component.

In another embodiment, a method of manufacturing a surface mount electrical device having a substrate and a pair of conductive electrodes is provided. The method comprises the steps of: providing a substrate having a first surface and a second surface; masking portions of the first surface of the substrate; creating a plurality of apertures from the first surface to the second surface of the substrate by plasma processing unmasked portions of the substrate; depositing a first conductive material on the substrate to form the electrode adjacent the apertures, wherein the conductive material extends through the apertures and on the first and second surfaces; electrically connecting the electrodes to an electrical component; and depositing a protective layer over a portion of the first surface of the substrate, the protective layer having a substantially flat upper surface.

In yet a further embodiment, a method of manufacturing a plurality of surface mount electrical devices, each device including a substrate and an electrical protection component coupled between a pair of conductive electrodes, the substrate having a first conductive layer, a first surface and a second surface is provided. The method comprises the steps of: providing the substrate; masking portions of the first surface of the substrate; creating a plurality of apertures from the first surface to the second surface of the substrate by plasma processing unmasked portions of the substrate; removing at least a portion of the first conductive layer; depositing a second conductive layer on the substrate to form an electrode adjacent the apertures, wherein the conductive material extends through the apertures and on the first and second surfaces; electrically connecting opposing electrodes with the electrical protection component; and providing a stencil print machine to deposit a protective layer over a portion of the first surface of the substrate, the protective layer having a substantially flat upper surface.

In yet another embodiment, a method of manufacturing a PTC circuit protection device is provided. The resistivity of a PTC material increases as the temperature of the material increases. PTC materials typically include a polyolefin material such as polyethylene, polypropylene and ethylene/propylene copolymers. One common application for the PTC device of the present invention is overcurrent protection. Upon a short circuit or power surge, the temperature of the PTC material raises as a function of the square of the current, which also raises the resistance of the PTC material. The surge current flowing through the PTC device is lessened, wherein an equilibrium is reached. When the overcurrent condition subsides, the PTC device resets itself.

The method of making the PTC device includes: providing a resistive element made of a PTC material having a first surface and a second surface; placing a first conductive layer on at least a portion of the first surface; placing a second conductive layer on at least a portion of the second surface; electrically coupling a first electrode to a first terminal and a second electrode to a second terminal; and using plasma etching to manufacture the device. In an embodiment, plasma etching is used to produce, at least in part, an area in the device that receives the first terminal.

In still a further embodiment, a method for producing a device having circuit protection is provided. The method comprises the steps of: providing a device having at least one resistive layer including a PTC material having a top layer having located thereon a first electrode that may not extend across the entire surface and a bottom layer having a second electrode that may not extend across the entire surface; and using plasma etching to etch away a portion of the device to create an area for receiving a member that contacts the first electrode, allowing the first electrode to be electrically connected to a circuit.

It is therefore an advantage of the present invention to provide an improved process for manufacturing products including circuit protection.

Another advantage of the present invention is to provide an improved method for making through-holes in devices.

Yet another advantage of the present invention is to provide a method of making smaller fuses.

Another advantage of the present invention is providing an improved method for making blind holes to create devices having circuit protection.

A still further advantage in the present invention is to provide an improved method for etching a substrate.

Still further, an advantage of the present invention is to provide an improved surface-mounted electrical device.

Still further, an advantage of the present invention is to provide a method for cleaning through-holes that are drilled in a device.

A further advantage of the present invention is to provide an improved device including a through-hole having PTC material.

Moreover, an advantage of the present invention is to provide a method of producing apertures in a substrate with improved accuracy and tolerancing.

Yet another advantage of the present invention is to provide a method of producing various different geometries of apertures in a substrate.

Further, an advantage of the present invention is to provide a method of producing apertures in a substrate that does not require post-drilling clean-up and that reduces cost and eliminates the need for drill bits.

Additional features and advantages of the present invention will be described in and apparent from the detailed description of the presently preferred embodiments and the figures.

BRIEF DESCRIPTION OF THE FIGURES

FIG. 1 is a perspective view of a copper plated FR-4 epoxy sheet used to make a subminiature surface-mounted electrical protection component, e.g., a fuse, in accordance with the invention.

FIG. 2 is a view of a portion of the sheet of FIG. 1, and taken along lines 2-2 of FIG. 1.

FIG. 3 is a perspective view of one embodiment of the present invention, wherein the sheet of FIG. 1 is stripped of its copper plating after which a plurality of apertures (slots or holes that are partially shown) are made, each aperture having a diameter, D (if hole), spaced apart by a length, L, and a width, W, and routed into separate quadrants of the sheet.

FIG. 4 illustrates one preferred embodiment, wherein the copper layer serves as a mask, and wherein copper is etched away creating portions where the apertures are plasma etched.

DETAILED DESCRIPTION OF THE INVENTION

The present invention provides methods for manufacturing devices having circuit protection and devices so manufactured. It should be appreciated that a variety of such devices can be manufactured.

Figure 11:
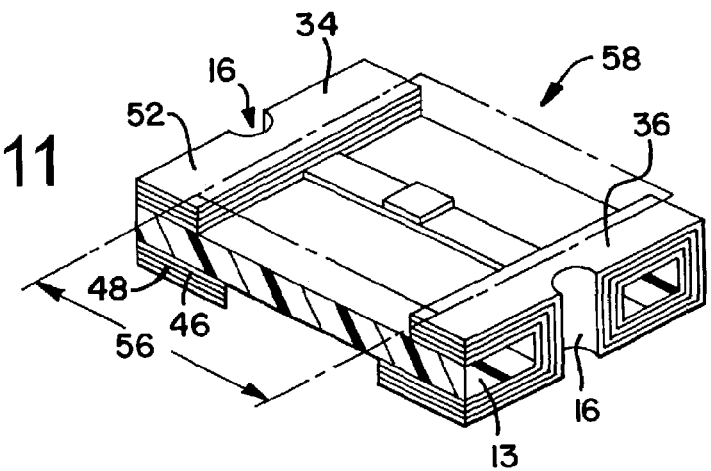
FIG. 11 shows the individual fuse in accordance with the invention as it is finally made, and after partitioning the substrate via a dicing or a plasma processing operation that separates the substrate into strips along parallel and perpendicular planes to form individual surface-mountable fuses.

An embodiment of the present invention is shown in FIG. 11. The thin film, surface-mounted electrical protection component is a subminiature device used in a surface mount configuration on a PC board. One such electrical protection component is a fuse. A fuse common in the art is an "A" case fuse. The standard industry size for "A" case fuses is 120 mils long by 60 mils wide. The "A" case fuse is also designated as a 1206 fuse. In addition, the present invention includes even smaller sized fuses, which are compatible with standard sized surface mountable devices. The present invention can be used with all other standard sizes of such surface mountable device sizes, such as 1210, 0805, 0603 and 0402 fuses, as well as non-standard sizes. The present invention can be used with a variety of different circuit protection devices and the like.

Pursuant to an embodiment of the present invention, a method of manufacturing a surface mount electrical device having a substrate and a pair of conductive electrodes connected to an electrical protection component is provided. Typically, the electrical protection component responds to a change in temperature, voltage or current, and can be, for example, a fuse. The substrate in one embodiment includes a solid sheet 10 of a non-woven insulative epoxy with copper cladding as shown in FIGS. 1 and 2. The sheet 10 can be any non-woven insulating material that is chemically, physically and structurally sufficient to be fabricated into a substrate, such as a PC board. One suitable non-woven material is 555F Arlon multi-functional epoxy, which hardens into a sheet. Plasma etching has been found to be more effective with non-woven epoxy sheets than with woven epoxy sheets, wherein the strands of the weave tend to create a non-uniform bore. Another suitable material for the solid sheet 10 is a polyimide, such as Kapton®.

The electrical protection component, or in this case, a fuse, may be made by the following process. The solid sheet 10 of non-woven epoxy with a copper cladding layer 12 is provided as shown in FIGS. 1 and 2. The copper cladding 12 and a non-woven epoxy core 13 of the solid sheet 10 may best be seen in FIG. 2. The non-woven epoxies and the polyimide material are among the class of materials having physical properties that are suitable to be used in the PC board industry and are compatible with other PCB materials. As a result, the fuse of the invention and the PC board to which that fuse is secured have extremely well-matched thermal and mechanical properties. The substrate of the fuse of the present invention also provides desired arc-quenching characteristics.

In one embodiment of the present invention, the copper cladding 12 is removed from the solid sheet 10 by a conventional etching process. For example, the copper cladding can be pattern etched to define apertures. During one conventional etching process, the copper is etched away from the substrate using a ferric chloride solution or an ammonia based etchant.

The non-woven epoxy sheet 10 is then subjected to plasma processing, wherein through-holes, bores, ovular slots, square slots or any other desired shape, collectively referred to herein as apertures 14, are created along four quadrants 10a, 10b, 10c, 10d of sheet 10, as may be seen in FIG. 3. Broken lines visually separate these four quadrants 10a, 10b, 10c, 10d in FIG. 3. It should be further noted that in FIG. 3, the apertures 14 are lined up into rows 27 and columns 29.

Although only four rows 27 of apertures 14 are shown in quadrant 10a of FIG. 3 for convenience, the rows 27 of apertures 14 are actually disposed over substantially the entire sheet 10 in all four quadrants 10a, 10b, 10c, 10d, as is designated by the three dots 11. For the "0603" standard sizing of surface mounted devices mentioned above, the length L between the center of the apertures 14 is approximately 70 mils, and the width W between the center of the apertures 14 is approximately 38 mils. For the "0402" standard sizing of surface mounted devices mentioned above, the length L between the center of the apertures 14 is approximately 50 mils, and the width W between the center of the apertures 14 is approximately 30 mils. Again, smaller and larger standard and non-standard sizings are possible for the present invention. The diameter D in FIG. 4 for each aperture 14 and notch 16 for the "0603" sizing is approximately 18 mils. It has been found that the "0402" devices are of such a small size that they are typically "full faced", i.e., do not incorporate castillated notches 16 created by the apertures 14 and the separation of the sheet 10 into individual devices.

In an embodiment, all of the copper layers 12 of FIG. 2 is etched away from the non-woven epoxy core 13 of this solid sheet 10. The remaining epoxy core 13 of the epoxy sheet 10 is different from a "clean" sheet of epoxy that had not initially been treated with a copper layer. In particular, dendrites in the copper layer poke into and roughen the surface of the core 13. The removal of the copper layers 12 leaves the core 13 having rough surfaces behind. The roughened surfaces of the epoxy core 13 are more receptive to subsequent operations that are necessary in the manufacture of the present surface-mounted electrical protection components, i.e., a subminiature fuse.

Plasma processing involves the use of a gas in an ionized state, i.e., an electrically charged gas containing ions, electrons, and free radicals. A bombardment of the substrate surface with the electrically charged gases chemically and mechanically reacts with the substrate 13, creating the apertures 14 and the notches 16. Apertures and notches 16 can be of any desired shape. Leaving the original copper layer 12 on the sheet 10 allows complex shapes, grooves, lines, etc. to be etched into the copper layer 12, where after a hole or bore of the same shape can be made in the epoxy core 13 using plasma processing.

In an embodiment, prior to plasma processing, the PC board is prepared to create the apertures 14. This preparation is very similar to preparing the PC board for plating a conductive layer on the substrate that will be fully discussed later. For instance, portions of the PC board that are not to be affected during plasma processing must be masked. The unmasked portions of the PC board are then subjected to plasma processing wherein the ionized gas, such as $NF_3$, $CF_4$ and $CF_4$ and $O_2$, chemically reacts with the substrate 13. The masking may be accomplished as is normally done in preparing a substrate for plating conductive layers. For example, if the copper layer 12 of the epoxy sheet 10 is completely removed initially, a photoresist type material can be deposited on the substrate. A pattern of those areas that are to be effected during plasma processing is placed over the photoresist. The photoresist-covered substrate is exposed to a UV light wherein the exposed portions of the photoresist are cured, the uncured portions of the photoresist are then removed. The substrate is now ready to be subjected to plasma processing wherein the cured portions of the photoresist protect the underlying portions of the substrate from exposure to the ionized gas during plasma processing. After plasma processing, the cured portions of the photoresist are removed.

A simpler way of masking the etching process is to leave the copper layer 12 on the substrate 13 except in the areas where the plasma removal takes place. The original copper cladded layer 12 provides the plasma mask because plasma does not etch metal. That is, the plasma will etch bare areas of substrate 13 but will not etch copper or metal layer 12.

Plasma processing is a batch type process and typically involves the following equipment: a vacuum chamber, electrodes (RF antenna), RF power supply, vacuum system, gas flow controls, and a control device. The PC boards are placed between electrodes in an evacuated chamber. Depending upon the desired chemical reaction, a gas or gas blend is injected into the chamber and the vacuum is stabilized. The radio frequency power supply is then energized and a resulting discharge across the electrodes converts the gas molecules into electrons, ions, recombined molecules and free radicals which bombard the PC board and modify its surface. Several parameters determine the amount of surface modification. These parameters include: the amount of time the substrate is subjected to plasma processing; gas mixture; pressure; temperature; gas flow; RF power and frequency. Once the plasma processing is finished, the chamber is purged and brought back to atmospheric pressure.

If the initially provided cladded copper plating 12 is removed completely, and after the plasma processing has been completed, the entire etched sheet 10 shown in FIG. 3 is again plated with copper. This reapplication of copper occurs through the immersion of the etched sheet 10 of FIG. 3 into an electroless copper plating bath. Otherwise, if the original copper plating 12 is only removed in the plasma etched areas, the sheet 10 can be plated using an electroless bath to coat the inside of the apertures 14 or notches 16. This method of copper plating is well-known in the art.

The copper plating step results in the placement of a copper layer having a uniform thickness along each of the exposed surfaces of the sheet 10. For example, as may be seen in FIG. 4, the copper plating 18 resulting from this step covers both (1) the flat, upper surfaces 22 of the sheet 10; and (2) the vertical regions of the outer notches 16 and/or the vertical regions of the apertures 14. The apertures 14 and the notches 16 formed by plasmal processing can be of any desired shape, including round, ovular and rectangular shapes. These vertical portions of the notches 16 and/or apertures 14 are copper-plated because they ultimately form a portion of the terminal pads 34, 36 of the final fuse as will be further described below.

The uniform thickness of the copper plating will depend upon the ultimate needs of the user. Particularly, as may be seen in FIG. 4, for a fuse rated for 1/16 ampere, the copper plating 18 has a thickness of 2,500 Angstroms. For a fuse rated for 5 amperes, the copper plating 18 has a thickness of approximately 75,000 Angstroms for a particular width of the element.

After plating has been completed, to arrive at the copper-plated structure of FIG. 4, the entire exposed surface of this structure is covered with a photoresist polymer.

An otherwise clear mask is placed over the copper sheet 20 of FIG. 4 after it has been covered with the photoresist. Square panels are a part of, and are evenly spaced across, this clear mask according to the sizing of the fuse being manufactured. These square panels are made of an UV light-opaque substance, and are generally shown as the rectangle 30 shown in FIG. 5. Essentially, by placing this mask having these panels onto the copper sheet 20, several portions of the flat, upward-facing surfaces 22 of the copper sheet 20 from FIG. 4 are effectively shielded from the effects of UV light.

It will be understood from the following discussion that these square panels will essentially define the shapes and sizes of the fusible element 42 and the terminal pads 34, 36 on the upper portion 22 of the fuse. The fusible element 42 is integral with and in electrical communication with the terminal pads 34, 36. It will be appreciated that the width, length and shape of both the fusible element 42 and these upper terminal areas 60 may be altered by changing the size and shape of the UV light-opaque panels.

Figure 6:
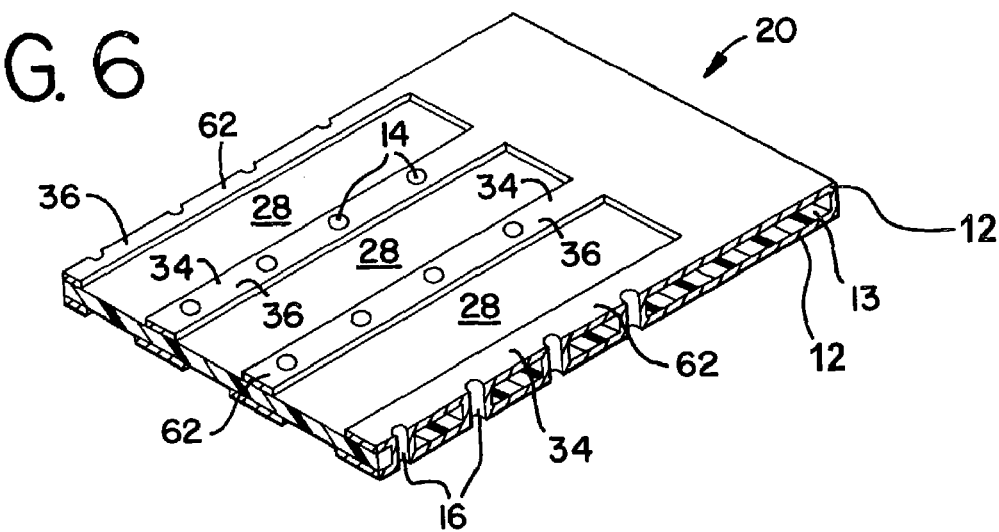
FIG. 6 is a perspective view of the reverse side of FIG. 5 but after the removal of a strip-like portion of copper plating from the sheet of FIG. 5.

Additionally, the back side of the sheet 20 is covered with a photoresist material and an otherwise clear mask is placed over the copper sheet 20 after it has been covered with the photoresist. A rectangular panel is a part of this clear mask. The rectangular panels are made of a UV light-opaque substance, and are of a size corresponding to the size of the panel 28 shown in FIG. 6. Essentially, by placing this mask having these panels onto the copper sheet 20, several strips of the flat, downward-facing surfaces 28 of the copper sheet 20 are effectively shielded from the effects of the UV light. The rectangular panels will essentially define the shapes and sizes of the lower terminal areas 62 of the terminal pads 34, 36, and the lower middle portions 28 of sheet 20, as shown in FIG. 6.

A portion of the copper plating on the underside of a sheet 20 is defined by a photoresist mask. Particularly, the copper plating from the lower, middle portions 28 of the underside of the sheet 20 is removed. The lower, middle portions 28 of the underside of the sheet 20 is that part of the strip along a line immediately beneath the areas 30 of clear epoxy, and the fuse elements 42. A perspective view of this section of this sheet 20 is shown in FIG. 6.

The entire photoresist-covered sheet 20, i.e., the top, bottom, and sides of the sheet, is then subjected to UV light. The sheet 20 is subjected to the UV light for a time sufficient to ensure curing of all of the photoresist that is not covered by the square panels and rectangular strips of the masks. Thereafter, the masks containing the square panels and rectangular strips are removed from the sheet 20. The photoresist that was formerly below these square panels remains uncured. This uncured photoresist may be washed from the sheet 20 using an aqueous based developer.

The cured photoresist on the remainder of the sheet 20 provides protection against the next step in the process. Particularly, the cured photoresist prevents the removal of copper beneath those areas of cured photoresist. The regions formerly below the square panels have no cured photoresist and no such protection. Thus, the copper from those regions can be removed by etching. This etching is performed with a ferric chloride solution or via a micro-etch process as is well known in the art.

After the copper has been removed, as may be seen in FIGS. 5 and 6, the regions formerly below the square panels and the rectangular strips of the mask are not covered at all. Rather, those regions now comprise areas 28 (bottom in FIG. 6) and 30 (top in FIG. 5) of clear epoxy. The sheet 20 is then place in a chemical bath to remove all of the remaining cured photoresist from the previously cured areas on the top and bottom of the sheet 20.

After completion of several of the operations described in this specification, the sheet 20 will ultimately be partitioned into a plurality of pieces, and each of these pieces becomes a fuse in accordance with the invention, as will be further described below. However, for the purpose of brevity, only a cutaway portion of the overall sheet including three rows 27 and four columns 29 is shown in FIG. 5. As may also be seen from FIGS. 5 and 6, the apertures 14 and notches 16 of the sheet 20 still include copper plating if the sheet 10 is originally stripped completely of copper and then completely replated. If the sheet is originally left plated except where plasma is etched, the apertures 14 and notches 16 are coated in a later electroless plating step. These apertures 14 and notches 16 eventually receive other layers of metal and form portions of the pads 34, 36. These pads 34, 36 will ultimately serve as the means for securing the entire, finished fuse to the PC board.

Figure 5:
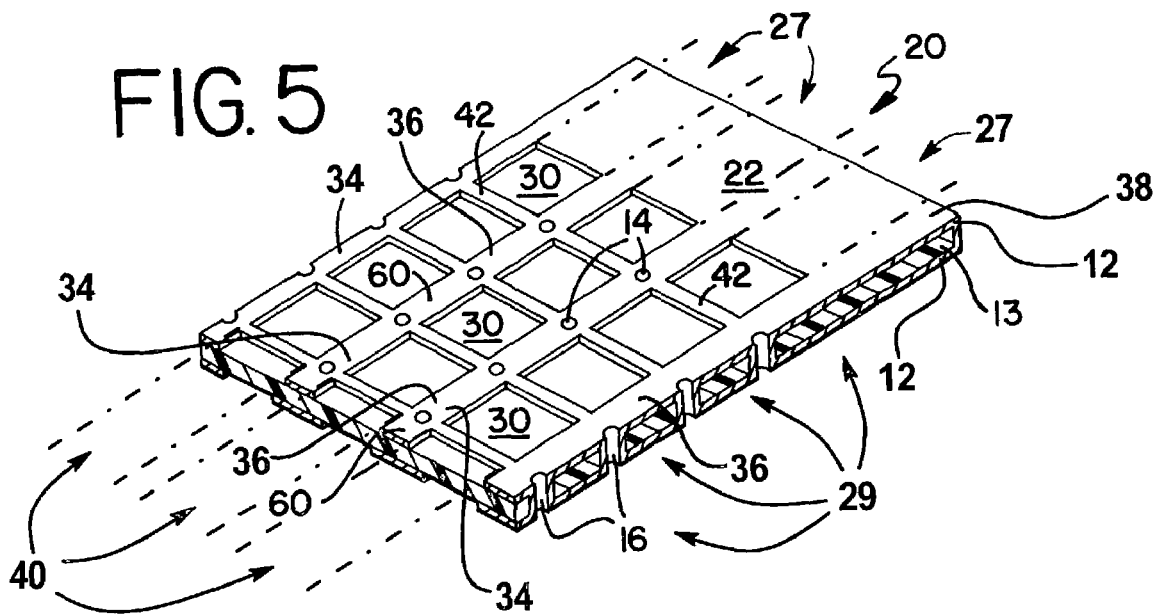
FIG. 5 is a cutaway perspective view of the flat, upward-facing surfaces of the copper sheet after the sheet was masked with a multi-squared pane of an ultraviolet (UV) light-opaque substance.

FIG. 5 is a perspective view of the opposite side of the sheet 20 from FIG. 6. Directly opposite and coinciding with the lower, middle portions 28 of FIG. 6 of the sheet 20 are linear regions 40 on the top-side 38 of the sheet 20. These linear regions 40 are defined by the dotted lines of FIG. 5.

FIG. 5 is also to be referred to in connection with the next step in the manufacture of the invention. In this next step, a photoresist polymer is placed along the entire top side 38 and bottom side (FIG. 6) of the sheet 20. Through the covering of the entire top and bottom sides, photoresist polymer is placed along the relatively thin portions which will comprise the fusible elements 42. These fusible elements 42 are made of a conductive metal, i.e., copper, and are integral, or continuous with the upper terminal areas 60. The photoresist polymer is then treated with UV light, resulting in a curing of the polymer onto the top side 38 and its associated fusible elements 42. The uncured photoresist is then removed. As a result of the curing of this photoresist onto the linear regions 40 and their fusible links 42, metal will not adhere to the linear regions 40 when the sheet 20 is dipped into an electrolytic bath containing a metal for plating purposes.

In addition, because the entire sheet has received the photoresist polymer, the middle portions 28 of the underside of the sheet 20 illustrated in FIG. 6 will also not be subject to plating when the sheet 20 is immersed into the electrolytic plating bath. The original copper metal layer previously covering this metal portion had been removed, revealing the bare epoxy that forms the base of the sheet 20. Metal will not adhere to or plate onto the bare epoxy using an electrolytic plating process.

Figure 7:
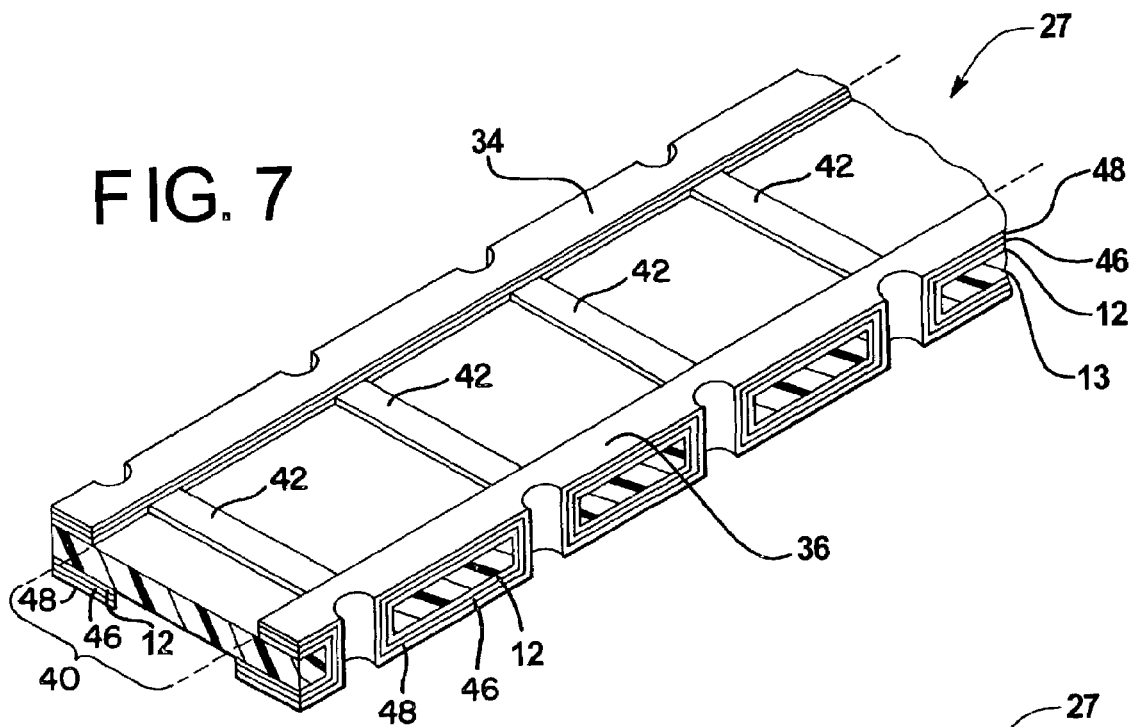
FIG. 7 is a perspective view of a single fuse row 27 from the sheet, cut away from the other fuse rows, and cut away at one edge of one of the fuses, after dipping the sheet into a copper plating bath and then a nickel plating bath, with the result that the copper and nickel layers are deposited onto the base copper layer of the terminal pads, including the grooves of the pads.

Next, the entire sheet 20 is dipped into and electrolytic copper plating bath and then an electrolytic nickel plating bath. As a result, as may be seen in FIG. 7, a copper layer 46 and a nickel layer 48 are deposited on the original base copper clad layer 12 or any replated layers (e.g., to the entire sheet or to the insides of apertures 14 and notches 16). After deposition of the copper 46 and nickel layers 48, the cured photoresist polymer on the linear region 40 and the fusible elements 42 is removed.

Photoresist polymer is then again immediately reapplied to the entire linear region 40. As may be seen in FIG. 8, however, a portion 50 at the center of the fusible element 42 as well as the terminal pads 34 and 36 are masked with a UV light-opaque substance. The entire linear region 40 is then subjected to UV light, with the result that curing of the photoresist polymer occurs on all of the region 40, except for the masked central portions 50 of the fusible elements 42. The masks are removed from the central portions 50 and the terminal pads 34 and 36 of the fusible elements, and the sheet 20 is rinsed. As a result of this rinsing, the uncured photoresist above the central portions 50 of the fusible elements 42 and the pads 34 and 36 are removed from the fusible elements 42. The cured photoresist along the remainder of the linear region 40, however, remains.

Plating of metal will not occur on the linear region 40 of the sheet 20 covered by the cured photoresist. Because of the absence of the photoresist from the central portions 50 of the fusible elements 42 and the pads 34, 36, however, metal may be plated onto the central portions 50 and the pads 34, 36 in one step or onto the pads 34 and 36 and the central portions 50 at different times. The illustrated embodiment of FIG. 8 shows one portion 50 per fusible element 42, however, one or more of the elements 42 may include a plurality of portions 50.

Figure 8:
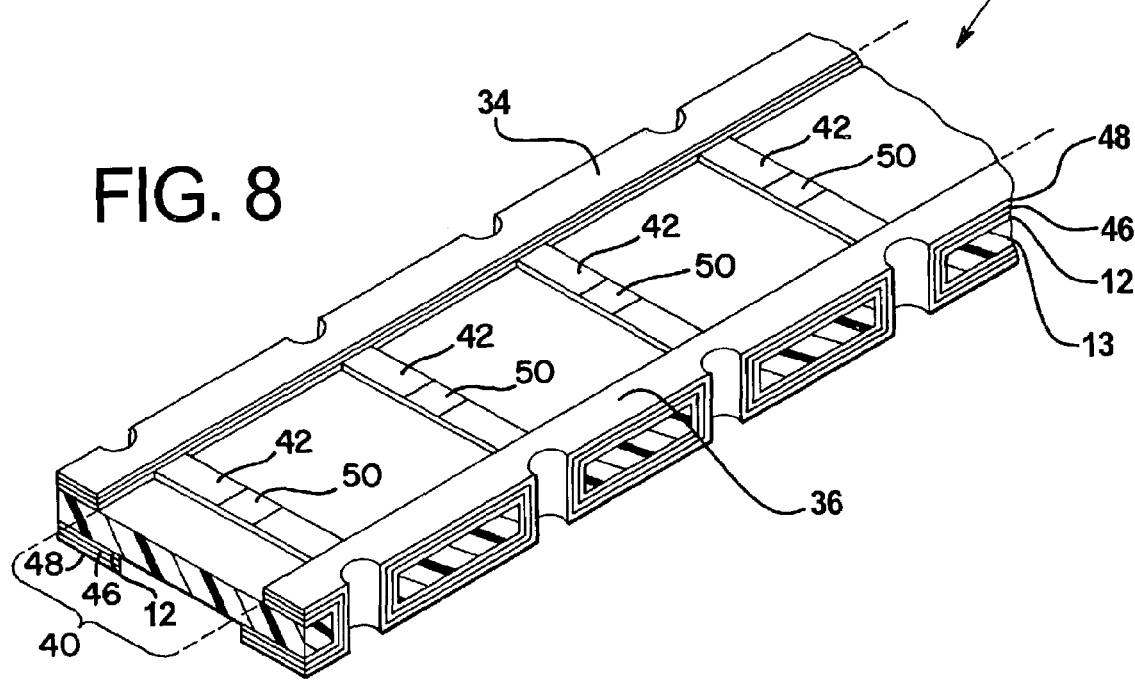
FIG. 8 is a perspective view of the strip 27 of FIG. 7, but prior to UV light curing, and showing a fuse-blowing portion 50 at the center of fusible element 42 that is masked with a UV light-opaque substance.

When the strip 27 shown in FIG. 8 is dipped into an electrolytic tin-lead plating bath, a tin-lead layer 52 (FIG. 9) is applied to the copper 46 and nickel layers 48 of the terminal pads 34 and 36. A tin-lead spot 54 is also deposited onto the surface of the fusible element 42, i.e., placed by an electrolytic plating process onto the central portion 50 of the fusible element 42. It will be understood, however, that this tin-lead may also be added to the surface of the fusible element 42 by a photolithographic process or by means of a physical vapor deposition process, such as sputtering or evaporation in a high vacuum deposition chamber. Furthermore, the spot 54 may be a different metal or alloy than lead-tin, may be of a variety of compositions of lead and tin and may be the same or different metal or alloy as that of the layer 52 applied to the pads 34, 36.

The spot 54 includes a second conductive metal, i.e., tin-lead or tin, that is dissimilar to the copper metal of the fusible element 42. In the illustrated embodiment, the spot 54 is deposited onto the fusible element 42 in the form of a rectangle, however, the spot may have any desired shape and there can be multiple spots 54.

The tin-lead spot 54 on the fusible element 42 provides the element 42 with certain advantages. The tin-lead spot 54 melts upon current overload conditions, creating a fusible element 42 that becomes a tin-lead-copper alloy. This tin-lead-copper alloy results in a fusible element 42 having a lower melting temperature than the copper alone. The lower melting temperature reduces the operating temperature of the fuse device of the invention, and this results in improved performance of the device.

Although a tin-lead alloy is deposited on the copper fusible element 42 in this example, it will be understood by those of skill in the art that other conductive metals may be placed on the fusible element 42 to lower its melting temperature, and that the fusible element 42 itself may be made of conductive metals other than copper. In addition, the second conductive metal or spot 54 may be placed in one or more notched sections of the link, or in holes or voids in that link. Parallel fuse links having the same or different configurations described are also possible. As a result of this flexibility, specific electrical characteristics can be engineered into the fuse to meet varying needs of the ultimate user. One of the possible fusible link configurations is a serpentine or otherwise non-linear configuration. By using a serpentine configuration, the effective length of the fusible element is increased, even though the distance between the terminal pads 34, 36 at the opposite ends of the non-linear or sepentine element remain the same. In this way, a non-linear or serpentine configuration provides for a longer fusible element without increasing the dimensions of the fuse itself.

Figure 10:
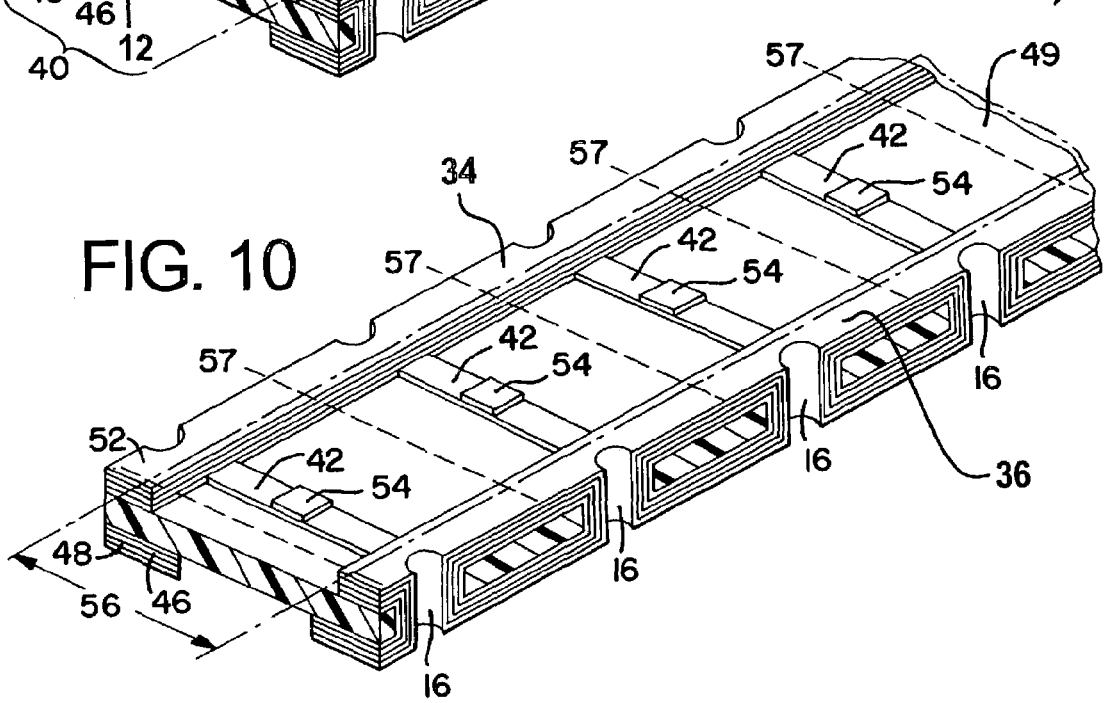
FIG. 10 shows the strip of FIG. 9, but with an added polymeric gel or paste layer onto the top of the fuse row 27.

The next step in an embodiment of the manufacture of embodiments of a device of the invention is the placement of a protective layer 56 across at least a significant portion of the top of the sheet 20 between the terminal pads 34, 36, (FIG. 10). Protective layer 56 forms a relatively tight seal over the portion of the top of the sheet where the fusible elements 42 exist. In this way, the protective layer 56 inhibits corrosion of the fusible elements 42 during their useful lives. The protective layer 56 also provides protection from oxidation and physical impacts during attachment to the PC board. The protective layer 56 also serves as a means of providing a smooth surface for pick and place operations which use a vacuum pick-up tool.

Additionally, the protective layer 56 helps to control the melting, ionization and arcing which occur in the fusible elements 42 during current overload conditions. The protective layer 56 or cover coat material provides desired arc-quenching characteristics, especially important upon interruption of the fusible elements 42.

The protective layer 56 in an embodiment includes a polymer, for example, a polyurethane gel or paste. One suitable polyurethane is made by Dymax Corporation, however, other similar gels, pastes, or adhesives are also suitable for the invention. In addition to polymers, the protective layer 56 may also include, alone or in combination, one or more conformal coatings and epoxies. This composition can be incorporated with a stencil print operation to apply the cover coat or layer 56. One suitable stencil printing machine may be obtained from Affiliated Manufacturers, Inc. of Northbranch, N.J. Model No. CP885.

During the stencil printing process, the material in an embodiment is applied to multiple strips simultaneously, instead of two strips at a time (an older die mold/injection filling process was typically limited to two strips.) As will be further explained below, the material is cured much faster than the injection fill process because in the stencil printing process, the cover coat material is completely exposed to the UV radiation from the lamps as opposed to the injection filling process, wherein the mold acting as a filter is used through which energy is transmitted from the lamp to the coating. Furthermore, the stencil printing process produces a more uniform cover coat than prior art injection filling processes, in terms of both height and width of the coating 56. Because of the improved uniformity, the fuses can be tested and packaged automatically. With the injection filling process it was sometimes difficult to precisely align the fuses in testing and packaging equipment due to some nonuniform heights and widths of the cover coat.

Although a colorless, clear cover coat 56 is aesthetically pleasing, alternative types of cover coats may be used. For example, colored, clear materials may be used. These colored materials may be manufactured simply by the addition of a dye to a clear polyurethane gel or paste. Color coding may be accomplished through the use of these colored gels and pastes. In other words, different colors of gels can correspond to different amperages, providing the user with a ready means to determine the amperage of any given fuse. The transparency of these types of coatings permits the user to visually inspect the fusible element 42 prior to installation, and during use, in the electronic device in which the fuse is used.

The use of the protective layer 56 has significant advantages over the prior art, including the so-called "capping" method. Due to the placement of the protective layer 56 over the element fuse body, the location of the protective layer relative to the location of the fusible element 42 is not critical.

Figure 9:
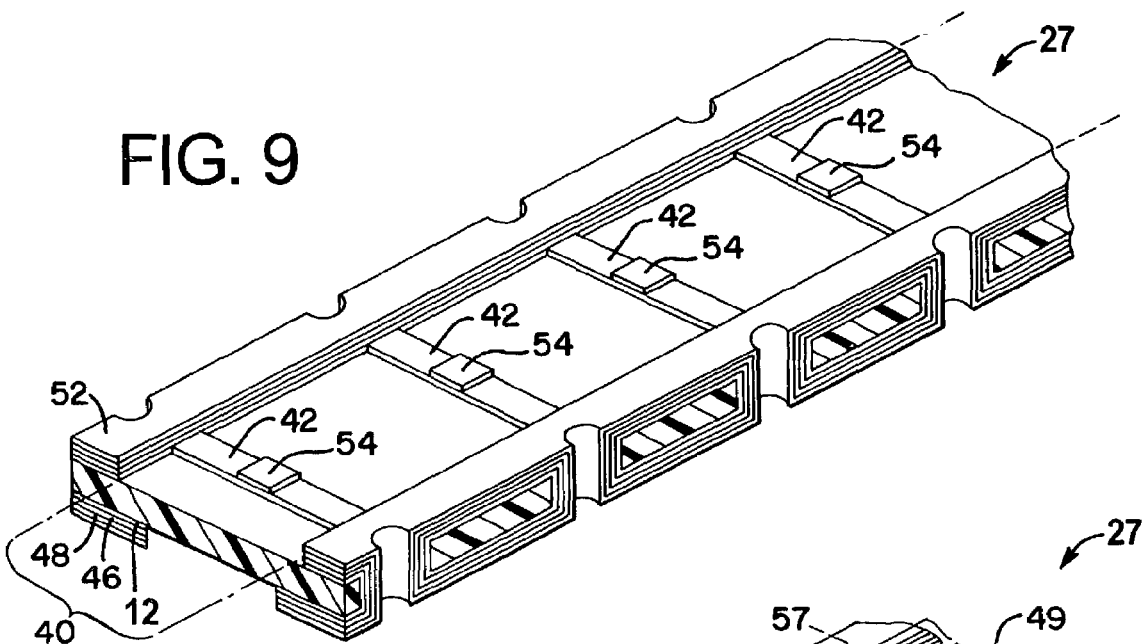
FIG. 9 shows the strip of FIG. 8, but after immersion into a final plating bath, such as a tin-lead bath, to create another layer over the copper and nickel layers, and after deposition of a low melting point alloy onto the central portion of the fusible link.

The sheet 20 illustrated in FIG. 9 is ready for a dicing operation that will separate the rows and columns 27, 29 (FIG. 5) from one another, and into individual fuses. During the dicing operation, a diamond saw or the like is used in an embodiment to cut the sheet 20 along parallel planes 57 (FIG. 10), including metal, and again perpendicular to planes 57, through the metal and center of the holes 14 (FIGS. 4 to 6), into individual thin film surface-mounted fuses 58 (FIG. 11). For example, FIGS. 7 to 10 illustrate one of the rows 27 that has been separated from the sheet 20. One of the directions of cuts bisect the terminal areas through the center of the holes 14, thereby exposing and creating the castillated notches 16 used for the terminal pads 34, 36. These holes 14 and notches 16 did not have the original copper clad layer 12 but have received an electroless layer of copper and each of the subsequent plated layers 46 and 48 and appear on either side of the fusible element 42.

In an alternative embodiment, plasma processing could be used to separate the fuses 58 if the metal layers 12, 46 and 48 of the pads 34 and 36 are either formed or later machined to have imposed areas of substrate 13 with which the plasma process will meet. Again, plasma processing will not etch or cut away the metal. The partitioning of the sheet 20 completes an embodiment of the manufacture of the thin film surface-mounted fuse 58 (FIG. 11) pursuant to the present invention. The plasma etching process of the present invention enables smaller devices to have fuse protection by shrinking the fuse.

It should be appreciated that other types of circuit protection may be used in place of the fuse element 42. For example, a voltage variable material ("VVM") may be used in place of the fuse element 42. Otherwise, a positive temperature coeficient ("PTC") element may be used in place of the element 42.

Figure 16:
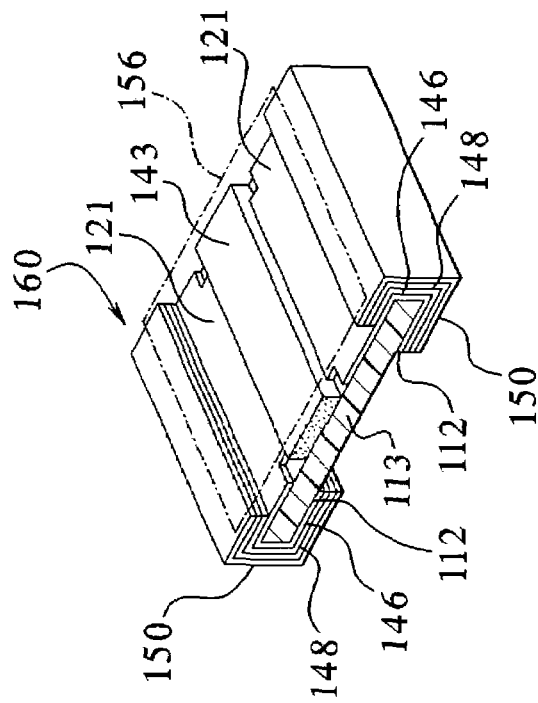
FIG. 16 shows the individual ESD/SMD in accordance with the invention as it is finally made, and after partitioning the substrate along parallel planes to form the individual devices.

Another embodiment of the present invention is shown in FIGS. 12 to 16. A thin film circuit device 160 illustrated in FIG. 16 is a subminiature overvoltage protection device in a surface mountable configuration for use in printed circuit board technology, commonly known as an electrostatic discharge surface-mounted device ("ESD/SMD"). The surface mountable device ("SMD") is designed to protect against electrostatic discharge ("ESD") damage to electronic components or circuits. The layout and design of the ESD/SMD device is such that it can be manufactured in many sizes.

As shown in FIGS. 12 to 16, the ESD/SMD protection device generally comprises three material subassemblies. A first subassembly of the device 160 generally includes a substrate carrier or substrate 113, electrodes 121, and terminals 134, 136 for connecting the protection device 160 to the PC board. A second subassembly of the device 160 includes the voltage variable polymer material 143, see FIG. 14, and a third subassembly of the device 160 includes a cover coat 156, see FIGS. 15 and 16.

The first or substrate carrier subassembly comprises a carrier base 113 having two electrodes 121 on the top surface, which are separated by a gap 125 of a controlled width and that wrap-around terminal pads 134, 136 on the top, bottom, and side of the first subassembly. The second subassembly or voltage variable polymeric material 143 is applied between these two electrodes 121 and bridges at least a portion of the gap 125. A cover coat 156 is placed over the polymeric material 143, the electrodes 121 on the top surface of the substrate subassembly and at least partially on the top of the terminal pads 134, 136. The third subassembly provides protection from impacts that may occur during automated assembly and provides protection from oxidation and other negative effects from use.

The first substrate subassembly incorporates a carrier base 113 made of a non-woven epoxy material similar to that used for the fuse 58 (FIG. 11) discussed earlier. The first subassembly further includes two metal electrodes 121 which are a part of the pads 134, 136 as one continuous layer or film. The pads 134, 136 are made of several layers, including the original base copper clad layer 121 (which also makes up the electrodes 121), a supplemental copper layer 146, a nickel layer 148 and a tin-lead layer 150. The base copper layer 112 of the pads 134, 136 and the electrodes are simultaneously deposited either: (1) originally by the manufacturer of the substrate 113; (2) by an electrochemical processes, such as the plating described in the embodiment above; or (3) by physical vapor deposition ("PVD"). After initial placement of the base copper 112 onto the substrate or core 113, additional layers 146, 148, 150 of a conductive metal are added to form the terminal pads 134, 136. These additional layers could be defined and placed onto these pads by photolithography and deposition techniques, respectively.

Photolithography, mechanical, or laser processing techniques are employed for defining the physical dimensions of the device, i.e., the width of the gap 125 and of the terminal pads 134, 136. Subsequent photolithography and deposition operations are employed to deposit additional metallization to the terminal pads, i.e., Cu, Ni, and Sn/Pb, to a specified thickness.

The voltage variable polymeric material 143 provides protection from fast transient overvoltage pulses. The cover coat 156 subassembly is applied after the metal deposition, pattern definition, and polymer 143 application process, to the top surface of the substrate/polymer subassembly to provide a means for protecting the polymeric material 143 and to provide a smooth top surface for pick-and-place surface mount technology automated assembly equipment. The cover coat 156 prevents oxidation of the electrodes 121 and the polymer 143, which can degrade the performance of the protection device 160. The cover coat 156 can be comprised of a variety of materials including plastics, conformal coatings, polymers, and epoxies. The cover coat 156 also serves as a vehicle for marking the protective devices 160 with the marking being placed between separate layers, or on the surface of the cover coat 156 through an ink transfer process or laser marking.

Figure 12:
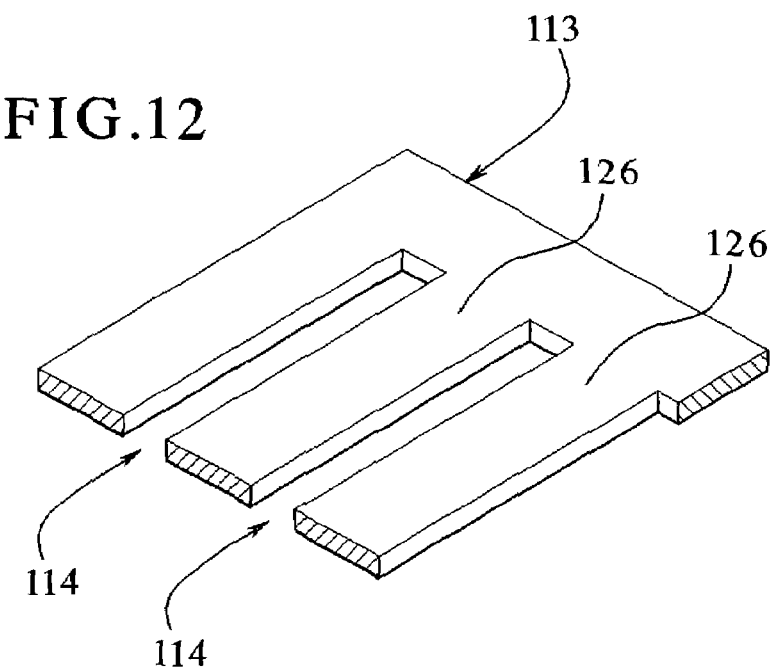
FIG. 12 is a perspective view of a cutaway portion of a sheet used to make surface-mount devices incorporating electrical protection components, i.e., ESD/SMD or PTC.
Figure 13:
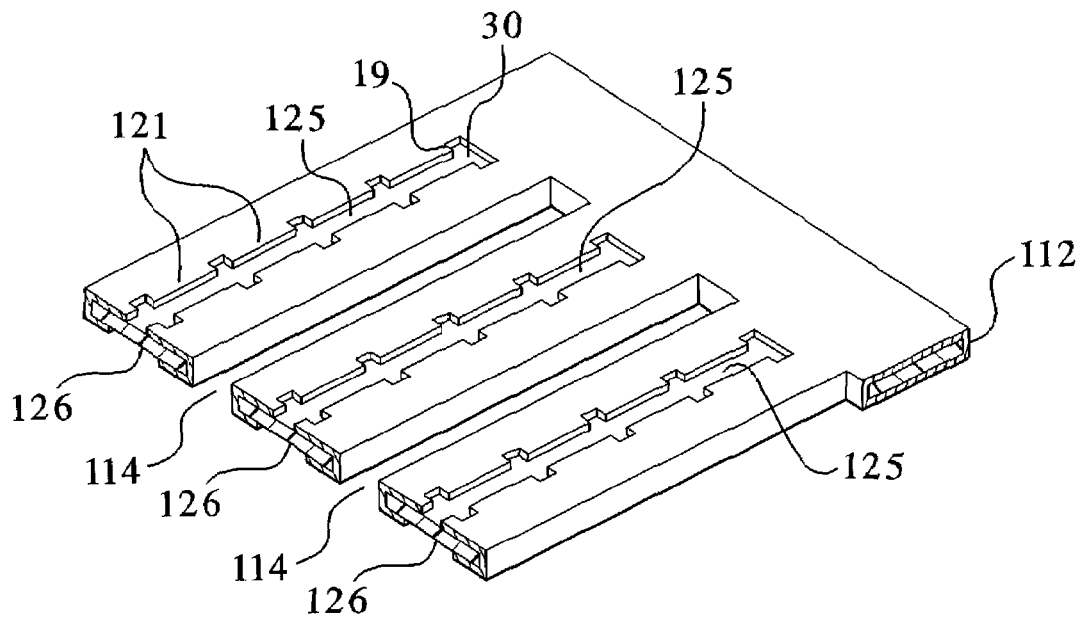
FIG. 13 is a perspective view of several portions of the flat, upward-facing surfaces of the copper sheet of FIG. 2, after each of those portions were masked with a patterned panel of ultraviolet (UV) light-opaque substance.
Figure 14:
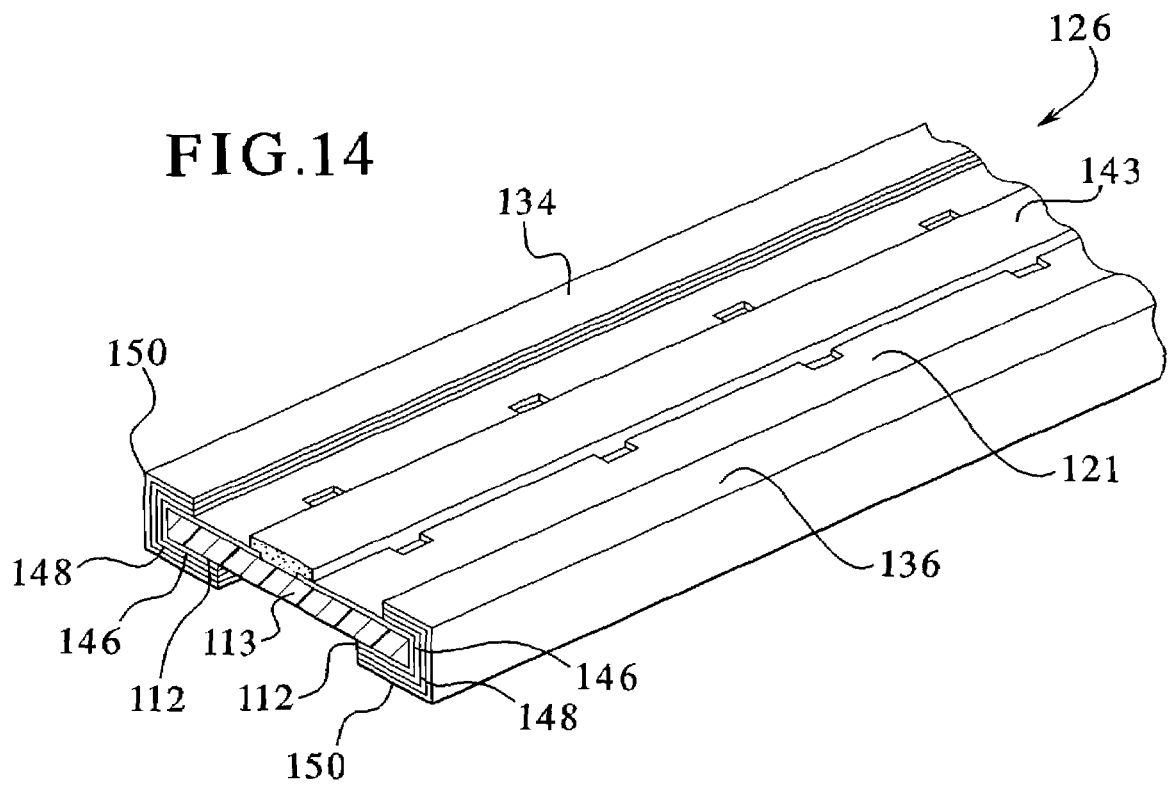
FIG. 14 shows a strip of FIG. 13, but with a polymeric material 143 added into the gap 125 of the strip 126.
Figure 15:
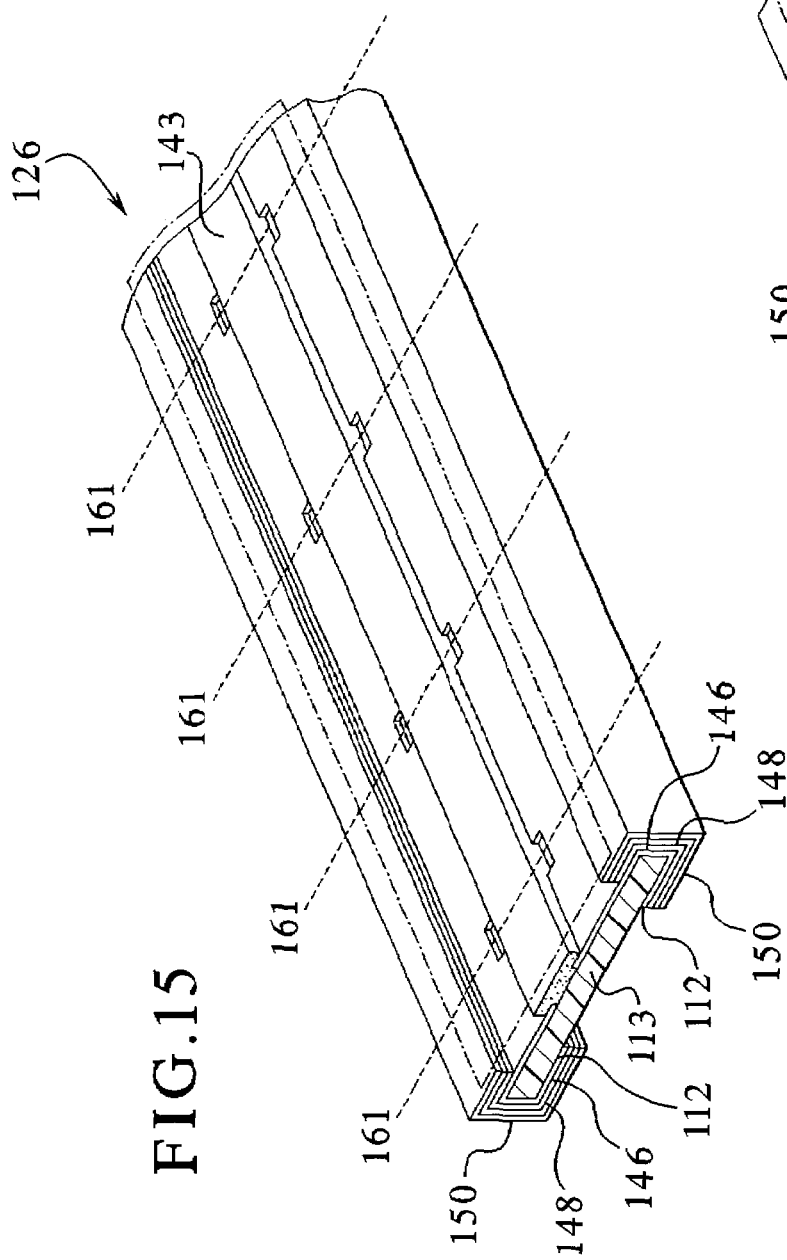
FIG. 15 shows the strip of FIG. 14, but with an added cover coat 156 over the electrodes and polymeric material 143.

The ESD/SMD protective device 160 can be manufactured using similar techniques previously discussed for the fuse 58 (FIG. 11). Shown in FIG. 12 is a non-woven epoxy sheet 113. FIG. 13 shows the solid sheet 113 with copper cladding 112, which is provided by the manufacturer of the non-woven sheet 113. In an alternative embodiment, the original copper cladding can be stripped and a new layer can be replated onto the bare epoxy sheet as described above.

The creation of the various conductor levels is in an embodiment similar to that of the fuse 58 and includes masking, subjecting to UV light, etching and plating the conductive layer(s), removing the mask, etc. One difference between the manufacturing process for the fuse 58 and that of the ESD/SMD 160 relates to the creation of elongated slots 114 (FIGS. 12 and 13) instead of a series of apertures 14 as shown above for example in FIG. 4. As in the creation of the apertures 14 for the fuse 58 device, the slots 114 are also created using plasma processing techniques.

After completion of several of the operations described herein, several strips 126 are partitioned from the sheet 113. The strips 126 are then partitioned into a plurality of pieces, each of these becoming an ESD/SMD or protective device 160. The partitioning is accomplished in an embodiment through a dicing operation as described above or through plasma processing if the strips have portions on the metal layers 112, 116, 148 and 150 exposed so that the plasma process can reach the epoxy sheet 113. During the dicing operation, a diamond saw or the like is used to cut the strips 126 along parallel planes 161 (FIG. 15) into individual thin film surface-mounted ESD/SMDs 160 (FIG. 16).

Figure 17:
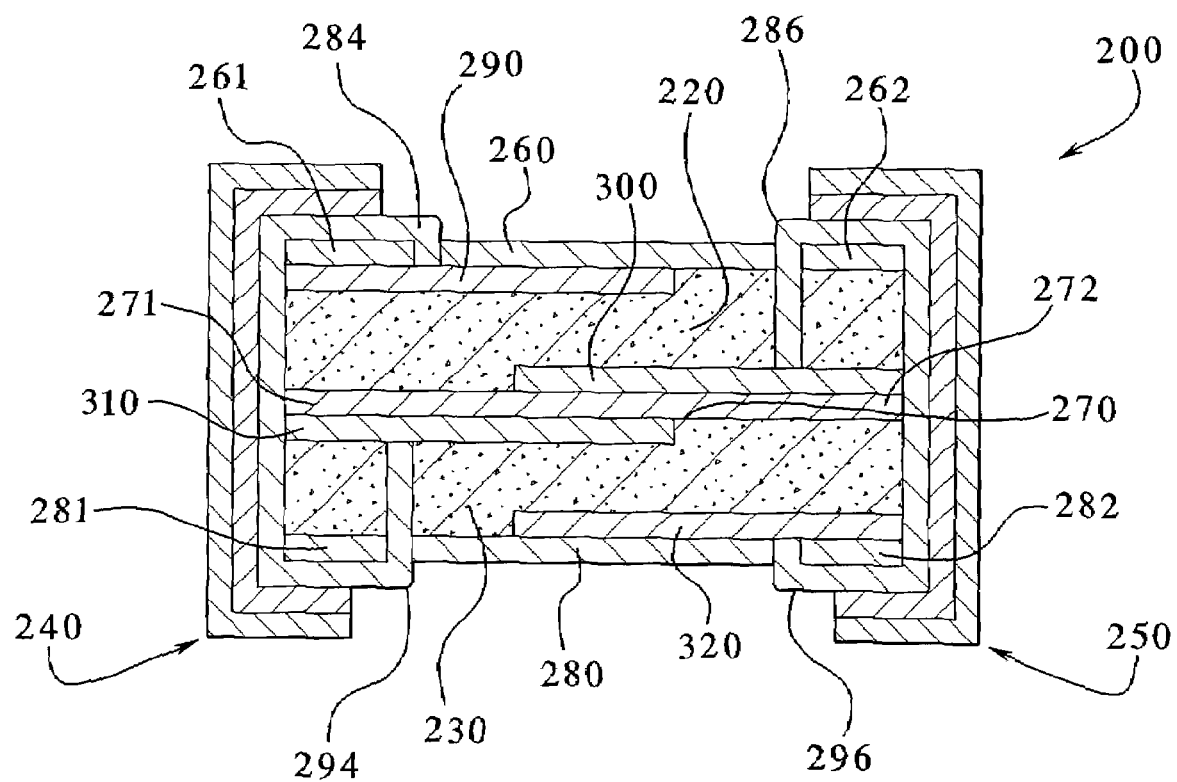
FIG. 17 is a cross-sectional view of an electrical device incorporating a positive temperature element coefficient (PTC) element.

Referring now to FIG. 17, another embodiment of the present invention incorporates a PTC element. The manufacturing process for the PTC devices can be similar to that for the ESD/SMD techniques discussed previously in this specification above, wherein, conductors and electrodes are placed on a substrate using plating and etching, bores or slots are created in the substrate by plasma processing, and individual devices are partitioned from a large substrate.

In an embodiment, the PTC substrate is composed of a PTC composition comprised of a polymer component and a conductive filler component. The polymer component may be a single polymer or a mixture of two or more different polymers. The polymer component may comprise a polyolefin having a crystallinity of at least 40%. Suitable polymers include polyethylene, polypropylene, polybutadiene, polyethylene acrylates, ethylene acrylic acid copolymers, and ethylene propylene copolymers.

In one embodiment, the polymer component comprises polyethylene and maleic anhydride (such a polymer is manufactured by Du Pont and sold under the tradename Fusabond™). The conductive filler component is dispersed throughout the polymer component in an amount sufficient to ensure that the composition exhibits PTC behavior. Alternatively, the conductive filler can be grafted to the polymer.

Generally, the conductive filler component will be present in the PTC composition by approximately 25-75% by weight. Suitable conductive fillers to be used in the present invention include powders, flakes or spheres of the following metals: nickel, silver, gold, copper, silver-plated copper, or metal alloys. The conductive filler may also comprise carbon black, carbon flakes or spheres, or graphite. In one embodiment, the conductive filler component used in the present invention is carbon black (manufactured by Columbian Chemicals and sold under the tradename Raven™).

Particularly useful PTC compositions of the present invention have a resistivity at approximately 25° C. of less than 10 ohm cm, particularly less than 5 ohm cm, and especially less than 3 ohm cm. The PTC element has in an embodiment a first electrode in electrical contact with a first surface and a second electrode in electrical contact with a second surface of the PTC element. The electrodes may be in direct physical contact with the first and second surfaces of the PTC element, however, electrical devices of the present invention may also include a conductive adhesive composition which lies between the electrodes and the PTC element.

In one embodiment, the PTC element is sandwiched between two metal foil electrodes to form a laminate. Alternatively, the electrodes can be formed on the top and bottom surfaces of the PTC element using conventional electroless or electrolytic plating processes. The first and second electrodes in one embodiment include a metal selected from the group consisting of nickel, copper, silver, tin, gold and alloys thereof.

The final processing step includes partitioning the strips into a plurality of electrical devices. After slots have been created in the PTC sheet, a plurality of break-points are created by mechanical scoring in an embodiment. In an alternative embodiment, the terminal pads 34 and 36 are applied in a discontinuous manner onto the epoxy core 13, so that areas of exposed core 13 appear along the score lines 57. In this embodiment, the break points can be created by plasma processing. The break-points allow the final strips to be divided into a plurality of electrical devices by exerting minimal pressure at each break-point. Thus, the final strips can be efficiently divided into a plurality of electrical devices 100 by snapping or simply running the strip over an edge.

An embodiment of a PTC device 200 is illustrated in FIG. 17. The device 200 includes, in the illustrated embodiment, first and second PTC elements 220 and 230 electrically connected to substantially parallel first and second end terminations 240 and 250. The first and second PTC elements 220 and 230 are interposed between first, second, and third substrates 260, 270, and 280.

The substrates 260, 270, and 280 are electrically insulating and provide support for the device 200. The substrates can be a wide variety of materials and are in one embodiment a non-woven epoxy. The first substrate 260 has a first electrode 290 formed on the bottom surface thereof. The second substrate 270 has a first electrode 300 formed on one surface (top) and a second electrode 310 formed on another surface (bottom). The third substrate 280 has a first electrode 320 formed on a first (top) surface thereof. These electrodes can be any conductive metal. The electrode configurations are formed using, in one embodiment, plasma etching. However, the electrode configurations can be used using a conventional masking and edging process using plasma etching to remove any resins or smear.

As illustrated, a first electrode 290 formed on the first substrate 260 extends to one end 261 of the substrate 260 and contacts termination 240 but does not extend to the other end 262. The electrodes 300 and 310 formed on the second substrate 270 extend to opposite ends of the substrate, i.e., the first electrode 300 extends to end 272 to contact termination 250 but not end 271 while the second electrode 310 extends to end 271 to contact termination 240 but not end 272. The electrode 320 formed on the third substrate 280 also extends to one end 282 to contact termination 250 but not the other end 281 on the substrate 280.

It should be noted that any number of electrodes and PTC layers can be provided including providing only one PTC element. In this regard, a one layer device, or a multilayer device can be provided. Further, the plasma etching can be utilized to create various aspects of the device. For example, plasma etching can be used to create the apertures for the terminals or utilized to create select apertures in the insulative layers for allowing a better connection of the electrodes to the terminals. It is also possible to use plasma processing to etch blind or through-holes in the PTC element for any desired reason, such as aiding electrical contact between the PTC element and an electrode. To this end, plasma processing can remove the resin smear that results from drilling holes in a polymer based laminate, e.g., ceramic filled polytetrafluoroethylene (PTFE), non-woven epoxy or polyimide.

It should also be noted that a variety of devices including PTC material can be created. By way of example, reference is made to U.S. Pat. No. 6,023,403 and U.S. patent application Ser. No. 09/510,116 the disclosures of which are hereby incorporated by reference. These documents set forth a number of structures that can be created. The present invention can be used with such devices and specifically the plasma etching methods discussed herein can be used to construct, in part, the devices.

As noted above, pursuant to the present invention, plasma etching can be used to make a wide variety of products having circuit protection. For example, the plasma etching process can be used to drill blind holes and/or through-holes. In this regard, FIG. 17 illustrates hole 284 that has been plasma etched from an outer surface of the substrate 260 (non-woven epoxy or polymide) to an electrode 290. The plasma etches through the substrate 260 until it reaches the metal electrode 290, wherein the metal prevents any further etching. The electrode 290 is then electrically connected to the termination 240. Thus, circuit protection devices 200 including blind holes or through-holes if no metal is in the way can be created. As stated above, the plasma processing removes the resin smear normally found with mechanical drilling of holes in a polymer based or non-woven epoxy substrate.

FIG. 17 also illustrates aperture 286, which has been plasma etched through the epoxy based substrate 260 as well as the polymer based PTC element 220. Aperture 286 extends through to the electrode 300 placed on the top surface of the substrate 270. It is also possible, although not illustrated, to plasma etch through each of or any amount of the substrates 260, 270 and 280 and the PTC elements 220 and 230 where no metal interrupts the bore. Apertures 284 and 286 are blind with respect to the device 200 because the apertures do not extend all the way through same. Apertures 284 and 286 are also through-holes in the respect that aperture 284 extends through the substrate 260 and aperture 286 extends through substrate 260 and PTC element 220. Furthermore, aperture 284 could extend only partially through substrate 260 and aperture 286 could extend only partially through PTC element 220.

FIG. 17 also illustrates that multiple apertures 284, 286, 294 and 296 are formed in multiple sides of the device 200.

Aperture 294 extends through lower substrate 280 and PTC element 230 so that termination 240 can communicate electrically with the electrode 310 placed on the underside of imbedded substrate 270. Aperture 296 extends through substrate 280 so that termination 250 can communicate electrically with lower electrode 320. The terminations 240 and 250 are filled into the polymeric and epoxy based apertures 284, 286, 294 and 296 via any method known to those of skill in the art.

Plasma etching also allows any shape of hole, aperture or groove to be created. In this regard, for a device including a metal covered polymer based substrate, the metal can be removed, using a known metal etching process, in any desired shape. Then a plasma etching process can be used to etch the epoxy based substrate to create a hole having a shape corresponding to the one etched into the metal. This provides numerous advantages as one can easily and accurately etch metal but, prior to the use of plasma, could not accurately replicate the hole in the substrate without distortion and smearing. Plasma processing allows for more repeatable, accurate and complex through-hole and blind hole type of apertures. The process applies to any device requiring holes in an epoxy-based or polymer based substrate, for example, a voltage variable material ("VVM") device, which reacts to an overvoltage condition.

It will be understood that while specific embodiments have been illustrated and described, numerous modifications come to mind without significantly departing from the spirit of the invention, and the scope of protection is only limited by the scope of the accompanying claims. The present examples and embodiments, therefore, are to be considered in all respects as illustrative and not restrictive, and the invention is not to be limited to the details given herein. While this embodiment has depicted the manufacturing process of a surface-mount device in a series of steps, one of ordinary skill in the art will know that the sequence of steps may be changed without significantly departing from the spirit of the invention.

The invention claimed is:

1. A method of manufacturing a positive temperature coefficient ("PTC") device comprising the steps of:
   providing a first substrate;
   placing primary electrodes on at least a portion of opposite surfaces of the first substrate;
   providing a PTC material over the electrodes and the opposite surfaces of the first substrate;
   placing secondary electrodes on at least a portion of the PTC material on opposite sides of the first substrate;
   placing insulative substrates on at least a portion of each of the secondary electrodes;
   forming at least one first aperture through at least one of the insulative substrates by plasma etching, said at least one first aperture terminating at one of the secondary electrodes;
   forming at least one second aperture through at least one of the insulative substrates and PTC material by plasma etching, said at least one second aperture terminating at one of the primary electrodes; and
   electrically coupling the secondary electrodes and primary electrodes to terminals.

2. The method of claim 1, wherein the plasma etching step creates a blind hole aperture.

3. The method of claim 1, wherein the plasma etching step produces, at least in part, an area in the device that receives the terminals.

* * * * *